(12) United States Patent
Khursheed

(10) Patent No.: US 6,897,441 B2
(45) Date of Patent: May 24, 2005

(54) REDUCING CHROMATIC ABERRATION IN IMAGES FORMED BY EMMISSION ELECTRONS

(75) Inventor: Anjam Khursheed, Kent Vale (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/613,700

(22) Filed: Jul. 3, 2003

(65) Prior Publication Data

US 2004/0004773 A1 Jan. 8, 2004

Related U.S. Application Data

(60) Provisional application No. 60/393,133, filed on Jul. 3, 2002.

(51) Int. Cl.[7] .............................................. H01J 37/285
(52) U.S. Cl. ........................ 250/306; 250/307; 250/310
(58) Field of Search ................................ 250/306, 307, 250/310

(56) References Cited

U.S. PATENT DOCUMENTS 6,737,647 B2 * 5/2004 Schonhense et al. ........ 250/310

OTHER PUBLICATIONS

J. Stohr & S. Sanders, "X–ray spectro–microscopy of complex materials and surfaces", IBM J. Res Develop, (2000), vol. 44, p. 535–551.

Omicron Vakuumphysik GMBH, "Focus PEEM", Jan. 2001, Germany.

D. Preikszas et al., "SMART electron optics", 12th European Congress on Electron Microscopy, Proceedings vol. III, Instrumentation and Methodology, (2000), p. 18–84.

H. Spiecker et al., "Time–of–Flight Photoelectron Emisssion Microscopy TOF–PEEM: first results", Nucl. Instrum. and Methods in Phys. Res., (1998), A 406, p. 499–506.

G.K.L. Marx et al., "Multipole WIEN–filter for a high–resolution X–PEEM", Journal of Electron Spectroscopy and Related Phenomena, (1997), vol. 84, p. 251–61.

A. Khursheed, "Ultimate resolution limits for scanning electron microscope immersion objective lenses," Optik, (2002), vol. 113, No. 2, p. 67–77.

B.P. Tonner et al., "A Photoemission microscope with a hemispherical capacitor energy filter", Journal of Electron Spectroscopy & Related Phenomena, (1997), vol. 84, p. 211–29.

J.E. Barth & P. Kruit, "Addition of different contributions to the charged particle probe size", Optik, (1996), vol. 101, No. 3, p. 101–109.

* cited by examiner

Primary Examiner—Jack I. Berman
(74) Attorney, Agent, or Firm—Dinsmore & Shohl LLP

(57) ABSTRACT

An imaging device, such as an EEM, includes an electric/magnetic lens used to focus pulsed electrons emitted from an object on to a target plane. Before a pulse of emitted electrons reaches the lens, electrons are spatially separated in dependence on their respective kinetic energies and are then subject to a time varying electric field that keeps the final focal plane constant for a wide variety of different energy electrons. The electric field compensates for variations in the image focal length caused by a spread in kinetic energies, causing the electrons to be focused proximate the target plane, reducing chromatic aberration. The varying electric field may be provided by varying an electric potential at the lens by, for example, varying a voltage supplied to an electrode at the lens. This potential effectively varies the focal strength of the lens in time, in order to compensate for variations in kinetic energies of electrons arriving at the lens, effectively keeping the image plane position constant.

31 Claims, 4 Drawing Sheets

REDUCING CHROMATIC ABERRATION IN IMAGES FORMED BY EMMISSION ELECTRONS

CROSS REFERENCE TO RELATED APPLICATIONS

This application claims priority from U.S. provisional patent application Ser. No. 60/393,133 which is entitled "Low Voltage Time of Flight Electron Emission Microscope," filed Jul. 3, 2002, and is hereby incorporated herein by reference.

FIELD OF THE INVENTION

The present invention relates to imaging objects with emission electrons.

BACKGROUND OF THE INVENTION

Many modern electrical imaging devices, such as modern electron emission microscopes (EEMs), image an object of interest (also called specimen or sample) by first accelerating and focusing electrons emitted from the object using an electric/magnetic objective lens, and then further magnifying the image by using a series of electric/magnetic projector lenses. An electric/magnetic lens typically generates electric or magnetic fields, or a mix of both, in the path of a beam of emitted electrons for altering the trajectories of the emitted electrons, analogous to the way a glass lens alters the trajectory of a beam of light.

A typical conventional EEM has a radiation source for illuminating an object to be imaged, an electron detector for detecting electrons emitted from the object as a result of the radiation, and one or more electric/magnetic lenses for directing the emitted electrons towards the electron detector to form a magnified image of the object at the detector. In a typical EEM, an electrostatic objective lens is positioned close to the object and has an electrical potential higher than that of the object (usually in the range of 10 to 15 kV) for extracting and accelerating the emitted electrons.

The focal length of such an electric/magnetic lens varies with the kinetic energy of the electrons focused by it. That is, electrons of different energies will be focused at different focal points. For example, the focal length of a magnetic lens for an electron beam of kinetic energy E may be approximated by $$\frac{1}{f} = \frac{1}{8mE} \int_{z_1}^{z_2} B_z^2 dz, \tag{1}$$

where m is the electron mass, and $B_z$ is the axial magnetic field distribution. As such, a beam of electrons with dispersed energies is not focused in a single plane by an electric/magnetic lens. Not focusing a beam in a single plane results in distortion of the image formed on a single plane. This distortion due to variation in kinetic energy of the emitted electrons is referred to as chromatic aberration. Thus, the spatial resolution of electric/magnetic lenses is limited in part by chromatic aberration.

In EEM, the initial kinetic energies of secondary electrons excited by X-ray radiation typically range from several to tens of electron-volts, and, consequently, chromatic aberration limits spatial resolution of an X-ray photoelectron emission microscope (XPEEM) to about 100 nm.

Several techniques have been developed for reducing chromatic aberration in EEM. The general approach is to filter out emitted electrons having kinetic energies outside a certain range. For example, contrast apertures and Wien filters have been used for such a purpose, improving spatial resolution of XPEEMs to about 20 nm. However, when emitted electrons of varied energies are eliminated, the intensity of emitted electrons arriving at the detector is reduced. Further, certain information is lost. Particularly, a full emission spectrum cannot be obtained.

An alternative approach is to operate an EEM in a time of flight (TOF) mode as, for example, described in "Time-of-Flight Photoelectron Emission Microscopy TOF-PEEM: first results", *Nuclear Instruments And Methods in Physics Research*, A 406, (1998), 499–506, H. Spiecker et al, ("Spiecker"). Spiecker discloses a photoelectron emission microscope (PEEM) with a pulsed radiation source. Emitted electrons are dispersed in a drift tube downstream of the imaging optics. The electrons are retarded at the entrance of the drift tube from ~700 eV to a drift energy of less than 100 eV and are imaged on a multi-channel plate (MCP) at the end of the tube. The electrons are then accelerated to a scintillator screen having a short decay time. Emitted electrons produced from a single radiation pulse are spatially separated in the drift tube due to the spread in their kinetic energy as the drift time of each electron is dependent on its drift energy. The images formed by electrons in different energy ranges are separately recorded in time. The chromatic aberration in each single image is reduced because the energy spread in electrons forming a single image is smaller than the spread in all transmitted electrons. However, this approach has several limitations. Specifically, only electrons within a narrow energy range are collected for each image and they represent only a small fraction of all of the emitted electrons. Accordingly, the acquisition time for a single image is long. As the TOF spectrometer is placed after the imaging optics, initial electron angular motions tend to limit separation of electrons with different energies within the drift tube, and hence the final spatial resolution of the image. Further, it is difficult to integrate this type of TOF spectrometer into a conventional XPEEM.

Another approach is to use a tetrode mirror for correcting both chromatic and spherical aberration, as described in "SMART electron optics", in 12th *European Congress on Electron Microscopy, Proceedings Volume III*, Instrumentation and Methodology, (2000), 81–4, D. Preikszas et al. The spatial resolution can be improved to about 2 nm with this approach. However, this approach requires complicated, precise design and positioning of the various lenses and, particularly, the tetrode mirror.

Thus, there is a need for an improved imaging device using emitted electrons with low chromatic aberration wherein both high spatial resolution and full spectrum of emitted electrons can be obtained simultaneously.

SUMMARY OF THE INVENTION

In accordance with an aspect of the present invention, an imaging device, such as an EEM, includes an electric/magnetic lens is used to focus pulsed electrons emitted from an object on to a target plane. Before a pulse of emitted electrons reaches the lens, electrons are spatially separated in dependence on their respective kinetic energies and are then subject to a time varying electric field. The electric field compensates for variations in kinetic energies, thus causing the electrons to be focused proximate a single plane, reducing chromatic aberration. The varying electric field may be provided by varying an electric potential at the lens, such as by varying a voltage supplied to an electrode at the lens. This potential effectively varies the focal length of the lens in time, in order to compensate for variations in kinetic energies of electrons arriving at the lens.

A drift chamber may optionally be provided for better spatial separation. As can be appreciated, since the energy spread in the emitted electrons is reduced at the lens, distortions in the image formed at the target plane due to chromatic aberration are reduced. The kinetic energy of the pulsed emitted beam of electrons may be kept relatively low, e.g. between 20 to 100 eV, so that they have significantly different arrival times at the lens. A low aberration electric/magnetic objective lens may be provided to reduce the effect of the initial angular spread of the emitted electrons. The magnetic and electric field strengths rapidly decrease from the specimen surface so as to strongly collimate the emitted electrons, thus reducing on-axis lens aberrations and minimising the effect of initial angular distribution on their transit times.

In accordance with an aspect of the invention, there is provided a method of imaging an object, includes illuminating the object to emit at least one pulse of electrons; directing the pulse of electrons along an optical path through a lens, towards a target to form an image of the object at the target; spatially separating electrons within the pulse in dependence on their kinetic energies, before the electrons reach the lens; providing a time varying electric field along the optical path remote from the object, the field varying in time so that the amount of energy provided to individual ones of the electrons in the pulse depends on their spatial separation within the pulse, thereby reducing energy dispersion of electrons passing through the lens and reducing the chromatic aberration in the image.

In accordance with another aspect of the invention there is provided an apparatus for imaging an object, includes a lens for focusing pulsed electrons emitted from the object and directed along an optical axis to form an image of the object at a target, and a correcting element positioned remote from the object, the correcting element electrically biased to have a dynamically changing voltage for correcting the kinetic energies of electrons passing through the lens, the voltage variable in synchronization with the pulsed electrons for correcting the kinetic energies of the pulsed electrons in dependence on arrival times at the correcting element.

In accordance with yet another aspect of the invention there is provided a method of imaging an object. The method includes illuminating the object to emit at least one pulse of electrons; directing the pulse of electrons along an optical path through a lens, towards a target to form an image of the object at the target; spatially separating electrons within the pulse in dependence on their kinetic energies, before the electrons reach the lens; varying a focal strength of the lens in time to compensate for variations in kinetic energies of individual ones of the electrons in the pulse, thereby reducing the chromatic aberration in the image.

In accordance with still another aspect of the invention there is provided an electric/magnetic lens for use in an electron emission microscope. The lens includes an electrode, having a controllable potential for varying energy imparted to electrons arriving at the electrode, and thereby the focal length of the lens.

Other aspects, features and advantages of the invention will become apparent to those of ordinary skill in the art upon review of the following description of specific embodiments of the invention in conjunction with the accompanying figures.

BRIEF DESCRIPTION OF THE DRAWINGS

In the figures, which illustrate exemplary embodiments of the invention.

DETAILED DESCRIPTION

Figure 1:
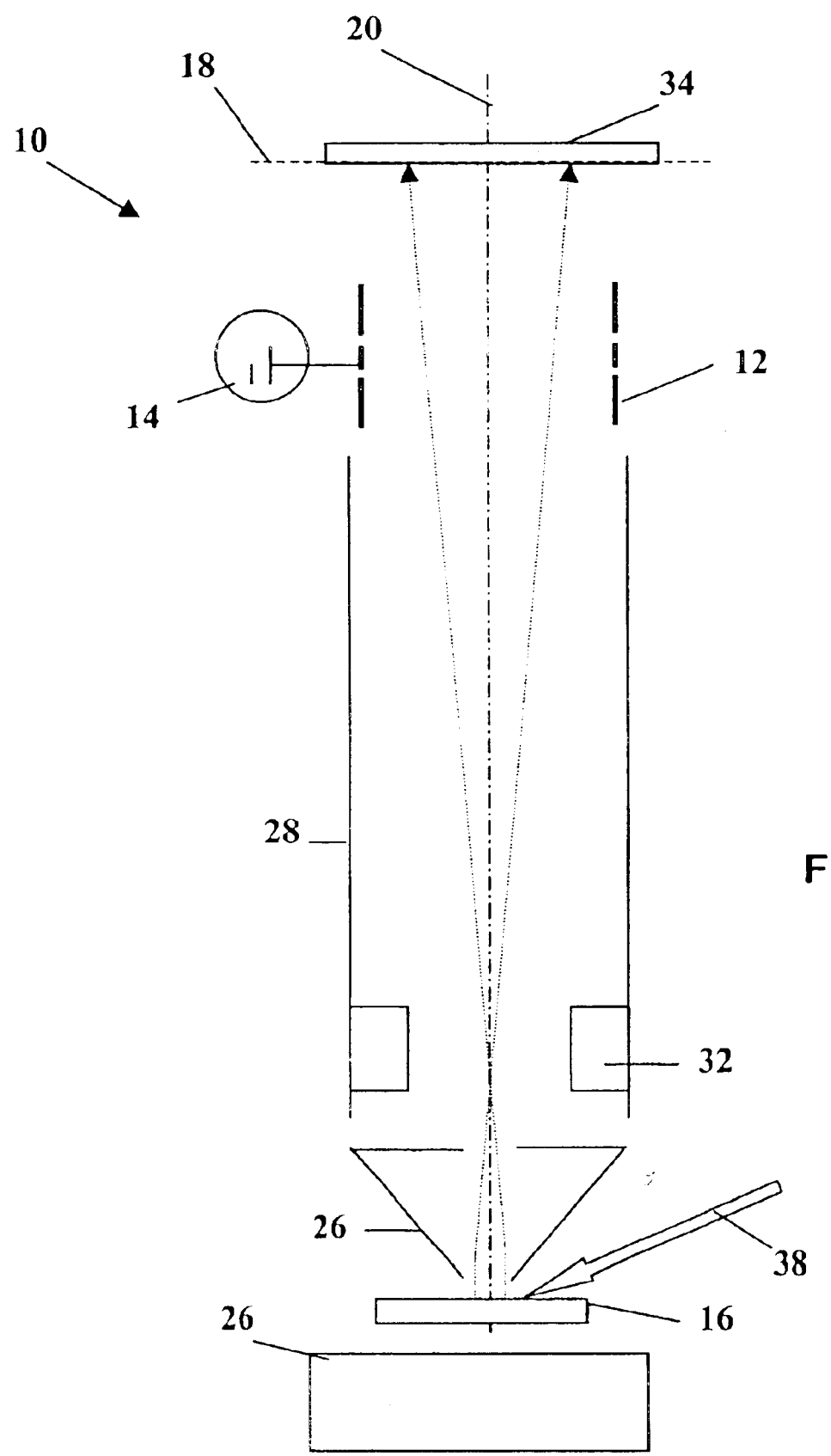
FIG. 1 is a simplified schematic diagram illustrating an EEM exemplary of an embodiment of the present invention.

FIG. 1 illustrates an EEM 10, exemplary of an embodiment of the present invention. EEM 10 includes an objective lens 26, a drift chamber 28, a dynamic projector lens 12, and an electron detector 34. An optional deflector/stigmator unit 32 also forms part of EEM 10. EEM 10 may be used to image an object 16 or a portion thereof using pulsed electrons emitted from object 16. Beam 38 may be a beam of electromagnetic waves, such as UV light or X-rays, or charged particles, such as electrons. A radiation source (not shown) may form part of EEM 10 to excite object 16 to emit electrons by generating radiation beam 38. Drift chamber 28 may have an axial length between 20 and 100 cm. An example detector 34 may include a multi-channel-plate (MCP) and a digital sampling oscilloscope to image object 16.

Lens 12 is positioned at a distance from object 16 to focus electrons emitted from object 16 in a target plane 18 along an optical axis 20 to form an image 22 of object 16.

An electrode 14 controls the electrical potential at lens 12, and thereby the electric field along optical axis 20 between drift chamber 28 and lens 12. The voltage on electrode 14 may be supplied by a signal generator and thus varied in time and synchronized with an input signal. Electrode 14 may take various shapes and be placed at various locations along optical axis 20. In EEM 10, exemplary projector lens 12 is a weak focusing electrostatic lens and electrode 14 is incorporated in projector lens 12: electrode 14 of projector lens 12 is biased by a signal generator for controlling the electrical potential at lens 12. Electrical potential at lens 12 can also be varied in various other manners known to a person skilled in the art.

Viewed another way, the potential at electrode 14 varies the focal length of lens 12, and allows the focal length of lens 12 to vary in time so as to compensate for the spread in kinetic energies of the emitted electrons focused by lens 12.

Electrode 14 varies potential at lens 12, and thereby the field along axis 20, compensating for the chromatic aberration effect in manners exemplary of the present invention, as described herein.

Specifically, the kinetic energy of an emitted electron arriving at lens 12 depends on both its initial kinetic energy at object 16 and the electrical potential at lens 12 at the time of arrival. Electrons within a pulse of electrons emitted from object 16 will arrive at lens 12 at different times if they have different initial kinetic energies. That is, the electrons will be spatially separated as a result of their travel along optical axis 20. Thus, when the potential at lens 12 varies as emitted electrons arrive, the kinetic energies of the emitted electrons passing lens 12 are modulated by the variance of the potential and will vary depending on their arrival time at lens 12. With a beam of pulsed electrons emitted from object 16, the potential at lens 12 can be controlled to vary in time to reduce the kinetic energy dispersion of electrons passing through lens 12. As the energy dispersion in the electrons at the lens is reduced, chromatic aberration can be reduced.

Again, viewed another way, the focal length of lens 12 varies in dependence on the potential at electrode 14. Change in focal length of lens 12 with time cause electrons with different arrival energies to be focused in the same plane.

The potential change required at lens 12 can be estimated as follows. Assuming an infinitely short pulse width, and denoting the spread in initial kinetic energy as $\Delta E_i$, the spread in arrival time at projector lens 12 as $\Delta t$, the required change in potential, $\Delta V(t)$, within time $\Delta t$ for eliminating any energy spread at lens 12 is, in theory, $$\Delta V(t) = \Delta E_i/e. \quad (2)$$

Beside the spread in initial kinetic energy, there are two additional factors that affect the spread in arrival time at lens 12: the speeds at which the pulsed electrons travel and the traveling distance between object 16 and lens 12 Clearly lower speeds and longer distance will result in a larger spread in arrival time.

In order to sufficiently spatially separate electrons of different initial energies in a pulse of emitted electrons, the pulsed electrons are allowed to travel a sufficient distance before they reach lens 12. Drift chamber 28 may therefore be provided. Drift chamber 28 electrically shields pulsed electrons passing through it from external electrical and magnetic fields. Drift chamber 28 may be biased to a low potential so that pulsed electrons entering it will have low kinetic energies and travel at low speeds within it.

Further, the kinetic energies of the pulsed electrons may be kept low before they reach lens 12 so that they travel at low speeds.

Figure 2:
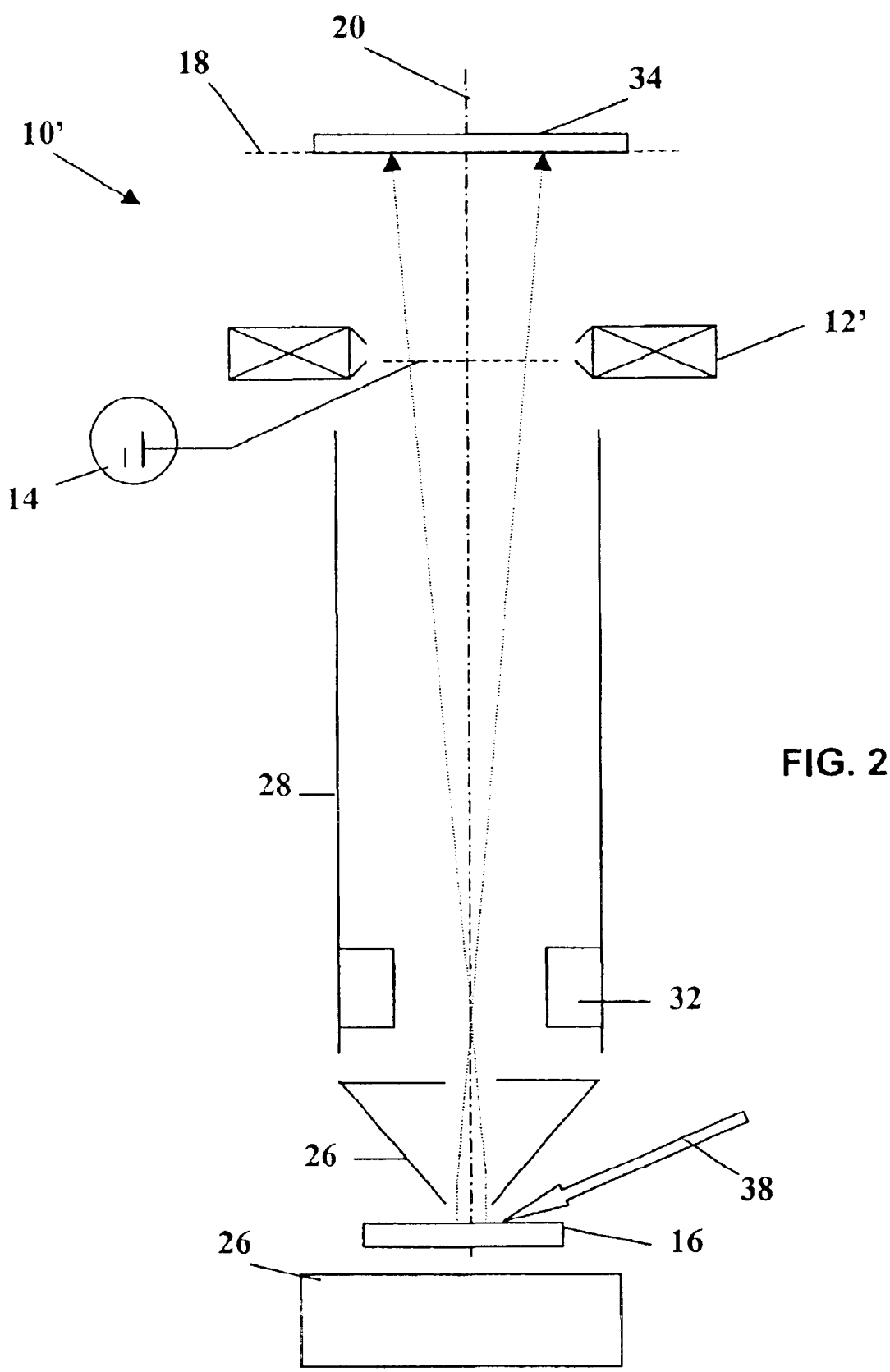
FIG. 2 is a simplified schematic diagram illustrating an EEM exemplary of a further embodiment of the present invention.

Optionally, projector lens 12 of EEM 10 may be replaced with a magnetic projector lens 12' as in EEM 10' depicted in FIG. 2. In the case of a magnetic lens, an electrically biased grid, acting as an electrode 14, may be placed between the pole-pieces of the magnetic lens to vary the potential at lens 12'.

An additional objective lens 26 (FIGS. 1 and 2) forms part of EEM 10 and 10' and is designed to work with a time of flight spectrometer, but may be designed to also work with other types of imaging energy filters, such as a Wien filter or an Omega filter. The optical magnification of objective lens 26 may be as high as 500 to 10,000. Objective lens 26 may have a focal length ranging from 20 to 200 $\mu$m. Objective lens 26 may use mixed electric and magnetic fields to extract and guide electrons emitted from object 16.

Figure 3:
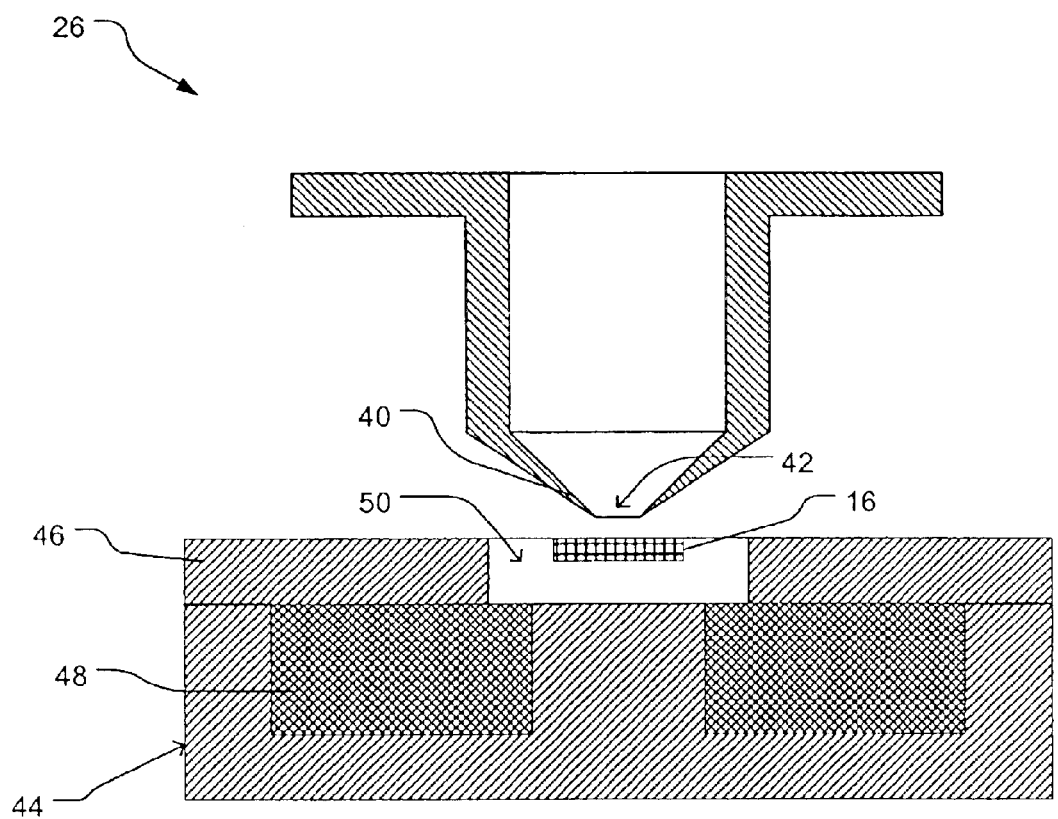
FIG. 3 is a schematic section view of the objective lens shown in FIGS. 1 and 2.
Figure 4:
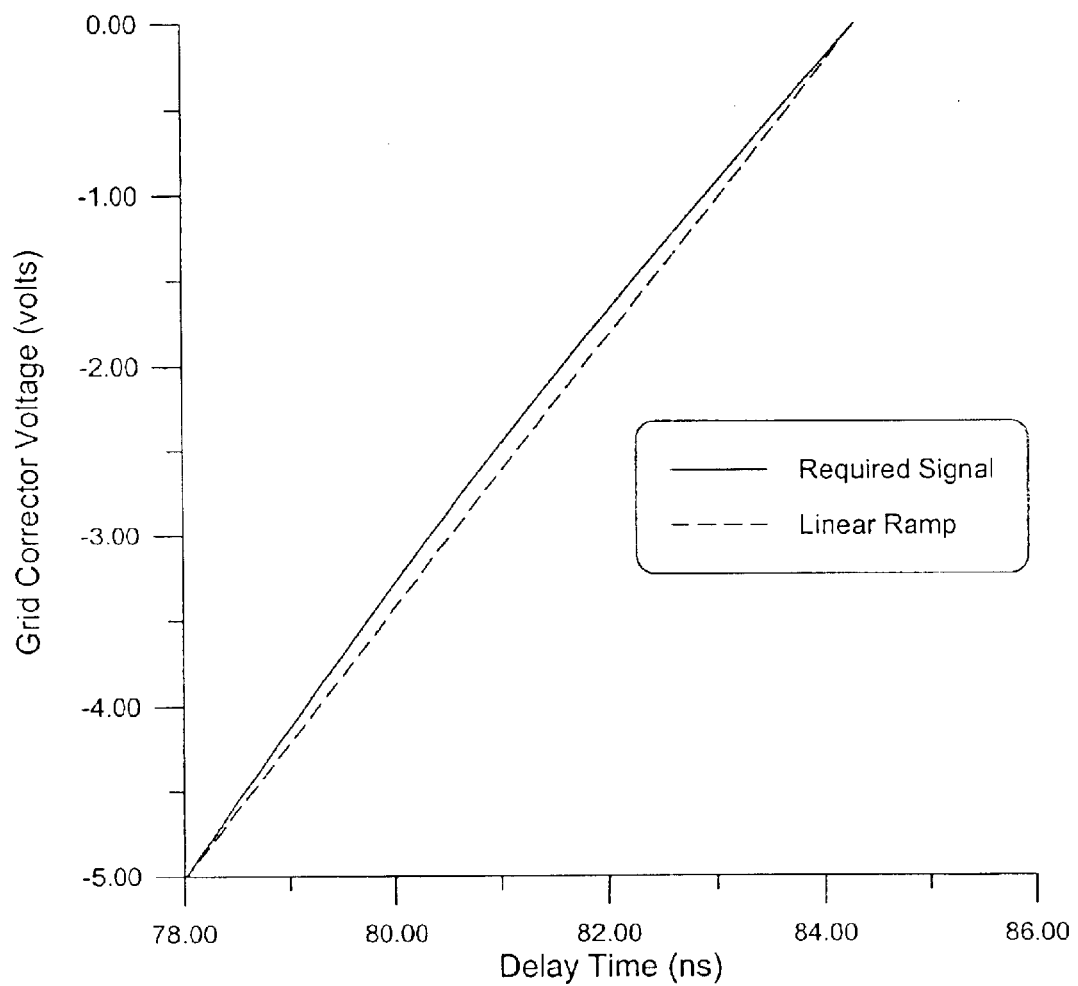
FIG. 4 is a line graph illustrating an example time varying voltage applied to an electrode of the EEM of FIG. 1 or 2, in manners exemplary of an embodiment of the present invention.

An exemplary embodiment of objective lens 26 is more particularly illustrated in FIG. 3. As illustrated, objective lens 26 may have a tapered tip 40 which has a small opening 42. The diameter of opening 42 of tapered tip 40 may be made small so that both axial magnetic and electric fields fall off sharply at opening 42. For example, diameters between 50 to 200 $\mu$m may be used. A smaller opening 42 results in smaller chromatic and spherical on-axis aberration coefficients. Magnetic fields are generated by electromagnet 44 placed below object 16. Electromagnet 44 comprises an iron casing 46 enclosing a coil 48. Casing 46 has a central opening 50 in its top plate for producing magnetic fields in the area around opening 42 of objective lens 26. Object 16 may also be placed in opening 42 of the top plate.

Of course, other types of objective lenses, such as those used in conventional EEMs may also be used. For example, objective lens 26 may be replaced with an electrostatic objective lens.

In operation, a radiation source radiates object 16 placed close to objective lens 26 with radiation beam 38, as illustrated in FIGS. 1 and 2. To generate pulsed emission electrons, radiation beam 38 may be pulsed. Pulses of electrons that have short width and are well separated are preferable because of easy separation of the electrons. Calculations show that beams with pulse width around one nanosecond for overall transit time of over 100 ns, will produce good results. In general, the width of the pulse at the specimen should be limited to be a small fraction of the total transit time. Of course, as can be appreciated, practical pulse width and repetition time are limited by many factors including the time resolution of various elements and control components of the microscope and efficiency considerations. For example, a pulse width of about 10 ns may be appropriate for longer overall transit times.

Alternatively, radiation beam 38 may be continuous or have a wide pulse width, in which case, object 16 may be driven by nanosecond-wide low voltage pulses at a desired repetition rate which effectively block emission of electrons.

Pulsed electrons emitted from object 16 may include secondary electrons, photoelectrons or other types of electrons, depending on the characteristics of radiation beam 38 and object 16.

Object 16 may be received in proximity to optional objective lens 26. Lens 26 may be electrically biased relative to object 16. Pulsed electrons emitted from object 16 are thus extracted and accelerated by objective lens 26 towards detector 34. A low potential difference between object 16 and object lens 26 may be advantageous to keep the kinetic energies of the pulsed electrons low. Thus, for example, object 16 may be biased to a voltage ranging from −100 to −20 volts, while the electrodes of objective lens 26 are grounded. Where the potential difference between object 16 and objective lens 26 is low, it may be advantageous to use an objective lens 26 as illustrated in FIG. 3. To operate such an objective lens 26, an electrical current is run through coil 48 to energize electromagnet 44 and thus generate the desired magnetic fields in objective lens 26. The magnetic flux flows around within iron casing 46 and through opening 50 to tapered tip 40.

Advantageously, the magnetic fields help collimate the emitted electrons, reducing the dependence of their subsequent transit times less on their initial angle of emission. Conveniently, a mixed field objective lens may give significantly lower on-axis chromatic and spherical aberrations in the final image than a purely electrostatic or purely magnetic field objective lens.

After exiting objective lens 26, pulsed electrons that are not blocked by deflector/stigmator unit 32 enter drift chamber 28. Drift chamber 28 may also be electrically biased with reference to object 16 so that there is a low potential difference between drift chamber 28 and object 16, which can be, for example between 10 and 100 V.

Since the potential difference between object 16 and drift chamber 28 is low, pulsed electrons entering drift chamber 28 will have low kinetic energies. Consequently, pulsed electrons travel at low speeds within drift chamber 28. Because the pulses are well separated from each other and electrons having different kinetic energies travel at different speeds, a pulse of pulsed electrons drifting in drift chamber 28 gradually become spatially separated along optical axis 20. Faster electrons will exit drift chamber 28 earlier and slower electrons will exit later. Workable time separation for a single pulse can vary from several to tens of nanoseconds in a typical configuration.

After exiting drift chamber 28, pulsed electrons will gain or lose kinetic energy depending on the electric field along optical axis 20, as influenced by the electrical potential difference between drift chamber 28 and projector lens 12 (or 12'). If drift chamber 28 has a higher potential than that at lens 12 (or 12'), pulsed electrons will lose kinetic energy. If drift chamber 28 has a lower potential, pulsed electrons will gain kinetic energy. The larger the difference, the larger the change in kinetic energy.

In any event, electrons eventually arrive at projector lens 12 (or 12'). Electrode 14 modulates potential at lens 12 (or 12') by several volts within a few nanoseconds using existing technology. As the voltage changes over time, the arriving pulsed electrons will gain or lose energy differently depending on when they reach projector lens 12 or 12', effectively varying the focal length of projector lens 12. For example, if the potential at lens 12 (or 12') is higher than at drift chamber 28 and increases over time, those pulsed electrons reaching projector lens 12 (or 12') earlier will gain less kinetic energies than those reaching there later. As those that arrive earlier have higher initial kinetic energies, the spread in kinetic energy is reduced. Thus, it is possible to modulate the voltage on the electrodes of lens 12, to compensate for the spread in kinetic energies of the pulsed electrons at projector lens 12 so that the effect of chromatic aberration in the formed image of object 16 can be reduced.

For example, the signal generator of electrode 14 can be synchronized with the radiation pulse 38. Each radiation pulse 38 triggers a cycle of voltage change on electrode 14. In each cycle, the voltage may be varied to minimize the energy spread in the electrons of a pulse traveling through projector lens 12

As will be appreciated, drift chamber 28 may not be necessary if pulsed electrons travel through sufficiently long distance, e.g. in a number of optical components (not all shown), before reaching projective lens 12 so that there is a sufficient separation in arrival time at projective lens 12.

To illustrate, the results of an example calculation is described below for the following conditions: the initial energies of the pulsed electrons are from 0 to 5 eV, object 16 is biased to −100 V, objective lens 26 and projective lens 12 are grounded, drift chamber 28 is biased to −75 V, the distance between object 16 and projective lens 12 is 12 cm.

Calculations show that the spread in electron arrival time at lens 12 is approximately 6.28 ns. Recalling equation (2), the potential at projector lens 12, or, the voltage on the electrodes of lens 12 (or 12'), need to increase by 5 V within 6.28 ns in order to minimize energy spread at projector lens 12 (or 12'). Many available fast signal generators can be used for generating this kind of voltage change.

Since the arrival time at lens 12 (or 12') is not linearly dependent on kinetic energy (rather it is linearly dependent on velocity) and since the kinetic energy of an emitted electron varies during its flight to lens 12 (or 12'), the required change in potential at lens 12 (or 12') for obtaining minimum spread in kinetic energy is not linear with time, as shown in FIG. 3, where the dotted line shows the linear change in time and the solid lines shows the required change in time.

The focused pulsed electrons leaving projector lens 12 are detected by detector 34 for forming an image of object 16. Detector 34 may have a relatively fast response time, e.g., in the sub-nanosecond range, so that the arrival time of pulsed electrons can be recorded accurately. Coarse focusing can be achieved by moving detector 34 along optical axis 20. Fine focusing can be achieved through varying the magnitude of electrical potential at projector lens 12.

Conveniently, as electrons in the emitted beam have been accelerated differently before reaching lens 12 (or 12') depending on their initial kinetic energies, the kinetic energies of electrons reaching lens 12 are more uniform, resulting in reduced chromatic aberration.

Calculations show that EEM 10 can have image resolution in the nanometer range, more than an order of magnitude improvement over the image resolution attainable by conventional PEEM systems.

By dynamically varying the potential on electrode 14, the energy spread at lens 12 or 12' is significantly reduced, this means that electrons with differing initial energies are focussed on to approximately the same image plane, significantly reducing the effect of chromatic aberration of the whole system.

Advantageously, the degree of contrast as compared to conventional X-ray absorption can be enhanced using EEM 10, since the entire spectrum of the photoelectron signal (from zero to several hundred electron-volts) can be directly monitored. In conventional PEEM systems, only the first few electron volts of the photoelectron energy spectrum is usually used to form the image.

As should now be appreciated, it is possible to minimize the spread in kinetic energy in different ways. Particularly, the potential at lens 12 or 12' may be controlled in different ways. For example, an electrically biased tube or plate, remote from lens 12 (or 12') and along the path of the pulsed electrons, either at, or upstream or downstream from, lens 12 (or 12') may also be used to dynamically vary the focal strength of lens 12 (or 12'), thus keeping the focal plane constant at the image plane. Similarly, in some situations it may be possible to dynamically modulate the potential at the final projector lens by changing a voltage on detector 34. Conveniently, modulating the potential of an electrode at or close to lens 12 can be advantageous for reasons such as compactness and ease of use.

In alternative embodiments, the bias voltage on drift chamber 28 can also be varied in order to examine a particular part of the emission spectrum in more detail. For instance, to examine the energy spectrum at around 200 eV, the drift chamber voltage can be biased to around 200 volts lower than that of the object 16. This means that all electrons having initial energies below 200 eV would be filtered (not entering drift chamber 28), while those having energies just above 200 eV will travel slowly through drift chamber 28 and have substantial spread in transit time. Therefore, their energy spectra can be analysed in more detail by a time of flight spectrometer. In addition, EEM 10 can be used to energy filter emitted photoelectrons from object 16 by selectively detecting them in time at the image plane. The detection system can operate by capturing information within a small time window that can be preset to any point in the detection cycle. Since in the time of flight spectrometer, the detection time directly corresponds to the initial energy of the electrons, time-windowing therefore effectively energy filters the captured image.

As can be understood, EEMs 10 or 10' may have alternative and additional components for proper or desired operation, which are readily appreciated and understood by those skilled in the art. For instance, alternative objective or projector lenses may be used. One or more projector lenses may also be added between objective lens 26 and drift chamber 28, between drift chamber 28 and projector lens 12, or downstream of projector lens 26. Further, where multiple lenses are used, the potentials at more than one lens may be dynamically controlled to reduce the overall chromatic aberration effect. Certain components of EEM 10 or 10' may also be removed. For instance, in an imaging apparatus similar to EEM 10 or 10' detector 34 may be removed and the focused emitted electrons may be bombarded on to a target so as to engrave an image of object 16 on the target.

Other features, benefits and advantages of the present invention not expressly mentioned above can be understood from this description and the accompanying drawings by those skilled in the art.

Although only a few exemplary embodiments of this invention have been described above, those skilled in the art will readily appreciate that many modifications are possible. The invention, rather, is intended to encompass all such modification within its scope, as defined by the claims.

What is claimed is:

1. A method of imaging an object, comprising:
   illuminating said object to emit at least one pulse of electrons;
   directing said pulse of electrons along an optical path through a lens, towards a target to form an image of said object at said target;
   spatially separating electrons within said pulse in dependence on their kinetic energies, before said electrons reach said lens;
   providing a time varying electric field along said optical path remote from said object, said field varying in time so that the amount of energy provided to individual ones of said electrons in said pulse depends on their spatial separation within said pulse, thereby reducing energy dispersion in said pulse at said lens and reducing the chromatic aberration in said image.

2. The method of claim 1, wherein said providing comprises varying an electric potential at said lens.

3. The method of claim 2, wherein said varying an electric potential comprises varying said electric potential to increase in time, in synchronism with said pulse.

4. The method of claim 3, wherein said lens comprises a projector lens.

5. The method of claim 3, wherein said lens comprises a magnetic lens.

6. The method of claim 3, wherein said target comprises an electron detector.

7. The method of claim 3, further comprising providing an objective lens proximate said object to magnify said image.

8. The method of claim 3, wherein said spatially separating comprises passing said pulse of electrons through a drift chamber positioned between said object and said target.

9. The method of claim 8, wherein the electric field in said drift chamber is substantially zero along said optical axis.

10. The method of claim 9, wherein said drift chamber has a length between 20 and 100 cm along said optical axis.

11. The method of claim 3, wherein said pulse of electrons proximate said object has a length less than 10 ns.

12. An apparatus for imaging an object, comprising:
    a lens for focusing pulsed electrons emitted from said object and directed along an optical axis to form an image of said object at a target, and
    a correcting element positioned remote from said object, said correcting element electrically biased to a voltage for correcting the kinetic energies of electrons passing through said lens, said voltage variable in synchronization with said pulsed electrons for correcting the kinetic energies of said pulsed electrons in dependence on arrival times at said correcting element.

13. The apparatus of claim 12, further comprising a drift chamber positioned upstream of said lens and said correcting element for allowing said pulsed electrons to drift so that said pulsed electrons travelling at different speeds become spatially separated in a direction along said optical axis within said drift chamber.

14. The apparatus of claim 13, further comprising a source for energizing said object to emit said pulsed electrons.

15. The apparatus of claim 14, further comprising a source for energizing said object to emit said pulsed electrons.

16. The apparatus of claim 13, wherein said lens comprises a projector lens.

17. The apparatus of claim 13, wherein said lens comprises a magnetic lens.

18. The apparatus of claim 13, further comprising an electron detector at said target.

19. The apparatus of claim 13, further comprising an electron spectrometer at said target.

20. The apparatus of claim 16, further comprising an objective lens proximate said object.

21. The apparatus of claim 20, wherein said drift chamber is positioned between said objective lens and said projector lens.

22. The apparatus of claim 21, wherein the electric field in said drift chamber is substantially zero in said direction of said optical axis.

23. The apparatus of claim 22, wherein the length of said drift chamber in said direction of said optical axis is between 20 and 100 cm.

24. The apparatus of claim 13, wherein said correcting element is positioned between said drift chamber and said detector.

25. The apparatus of claim 13, wherein said correcting element is positioned at said focusing lens.

26. The apparatus of claim 13, wherein said correcting element is positioned between said drift chamber and said lens.

27. The apparatus of claim 13, wherein said correcting element is integrated with said lens.

28. The apparatus of claim 20, wherein said objective lens has an opening between 0.05 to 0.2 mm for allowing said pulsed electrons to pass through.

29. A method of imaging an object, comprising:
    illuminating said object to emit at least one pulse of electrons;
    directing said pulse of electrons along an optical path through a lens, towards a target to form an image of said object at said target;
    spatially separating electrons within said pulse in dependence on their kinetic energies, before said electrons reach said lens;
    varying the focal strength of said lens in time to compensate for variations in kinetic energies of individual ones of said electrons in said pulse, thereby reducing the chromatic aberration in said image.

30. The method of claim 29, wherein said varying comprises varying an electric potential at said lens.

31. An electric/magnetic lens for use in an electron emission microscope, comprising:
    an electrode, having a controllable potential for varying energy imparted to electrons arriving at said electrode, and thereby the focal strength of said lens.

* * * * *

UNITED STATES PATENT AND TRADEMARK OFFICE
CERTIFICATE OF CORRECTION

PATENT NO. : 6,897,441 B2
DATED : May 24, 2005
INVENTOR(S) : Anjam Khursheed

It is certified that error appears in the above-identified patent and that said Letters Patent is hereby corrected as shown below:

Column 10,
Line 33, replace "at said focusing lens" with -- at said lens --.

Signed and Sealed this

Seventh Day of March, 2006

JON W. DUDAS
*Director of the United States Patent and Trademark Office*